United States Patent [19]

Burson et al.

[11] Patent Number: 4,677,322

[45] Date of Patent: Jun. 30, 1987

[54] FREQUENCY COMPARATOR CIRCUITS

[75] Inventors: Klye L. Burson; Scott O. Campbell; Apparajan Ganesan; Ronald A. Morrison, all of Indianapolis, Ind.

[73] Assignee: American Telephone and Telegraph Company, AT&T Technologies Inc., Murray Hill, N.J.

[21] Appl. No.: 641,400

[22] Filed: Aug. 16, 1984

[51] Int. Cl.$^4$ .......................... H03K 5/22; H03H 19/00
[52] U.S. Cl. ..................................... 307/525; 307/519; 307/523; 307/526; 307/527; 307/271; 328/127; 328/63
[58] Field of Search ...................... 328/127, 63, 14, 15; 377/47; 307/519, 522, 523, 525–527, 529, 271, 240

[56] References Cited

U.S. PATENT DOCUMENTS 4,496,858  1/1985  Smith .................................. 307/519
4,531,106  7/1985  Ganesan .............................. 333/173

Primary Examiner—Stanley D. Miller
Assistant Examiner—Richard Roseen
Attorney, Agent, or Firm—Volker R. Ulbrich; John A. Caccuro

[57] ABSTRACT

A voltage comparator (10) includes two sampled input networks connected in parallel between an input reference voltage (Vref) and the inverting input (16) of an integrator (12,14), the other input (18) of which is grounded. The first input network has a first input capacitor (C1) which is through-switched at a first sampling frequency (F1). The second input network has a second input capacitor which is diagonally-switched at a second sampling frequency (F2), thus providing an output voltage to the integrator (12,14) which is of opposite polarity to that of the first network. For a given ratio between the capacitors (C1,C2), the output (15) of the integrator is determined by the relationship between the sampling frequencies (F1,F2), thus providing a comparator capability. Also disclosed is a frequency lock loop (34) in which the output (Vcontrol) of a frequency comparator (38) is filtered of the switching frequencies and utilized as the control voltage for a voltage controlled oscillator (42). The output of the oscillator is then coupled to a switching pulse generator (44) which provides the switching pulses (F2,F2N) to the second input network of the comparator (38).

9 Claims, 2 Drawing Figures 4,677,322

FREQUENCY COMPARATOR CIRCUITS

TECHNICAL FIELD

The invention relates to electronic circuits of the type which reference one pulse frequency to another one.

Many electronic circuits require for their operation at least one train of clock pulses. These operate switches which determine the sequence of events in the circuit. A typical microprocessor circuit requires a number of pulse trains with different frequencies. The frequecies of these trains must be precisely fixed. For this reason the pulses are usually derived from a crystal oscillator in which the resonance element is a crystal, such as a color burst crystal having a 3.58 megahertz natural frequency. Lower frequencies are derived by means of frequecy divider circuits. The advantage of using a high frequency crystal, such as a color burst crystal, is that these are produced in large quantities for the television industry and are therefore low in cost. However, circuit power consumption, particularly in the case of complementary metal-oxide-silicon (CMOS) technology, increases linearly with the frequency. The lower the highest clock frequency of a circuit, the lower the switching power that is required. For circuits with the highest clock frequency much lower than the color burst frequency, there are several disadvantages to deriving clock pulses from the color burst frequency. One is that the power consumption for switching is excessive. Another is that the frequency divider circuitry, which usually includes several flip-flops, occupies valuable circuit chip area. A third is that the only integral divisions of the original frequency are available as a derived frequency.

SUMMARY OF THE INVENTION

In accordance with the present invention, a novel switched capacitor frequency comparator is used in a frequency lock loop configuration to establish a derived frequency from a reference frequency. The comparator is so constructed that the relationship between the derived and reference frequencies is determined by the relative values of two capacitors. This makes the circuit particularly useful for complementary metal oxide semiconductor (CMOS) circuits, in which such relative values can be readily determined with sufficient accuracy.

With the novel frequency lock loop, it is possible to generate a derived frequency which is higher than the reference frequency. This reduces power consumption by eliminating frequencies which are unnecessarily high for the required switching functions. The capability of generating a derived frequency which is higher than the refernce frequency makes it feasible for most purposes to use as a reference frequency resonance element a 32.768 kilohertz watch crystal instead of a more costly color burst crystal. This is especially advantageous for equipment which already contains a watch crystal for time-of-day information. Finally, since the derived frequency is determined only by a capicitance ratio, it may be a nonintegral division or multiplication of the reference frequency. This provides greatly increased flexibility in the design of the circuit itself and permit the use of a single reference frequency for virtually any pulse timing function in it.

DETAILED DESCRIPTION

Figure 1:
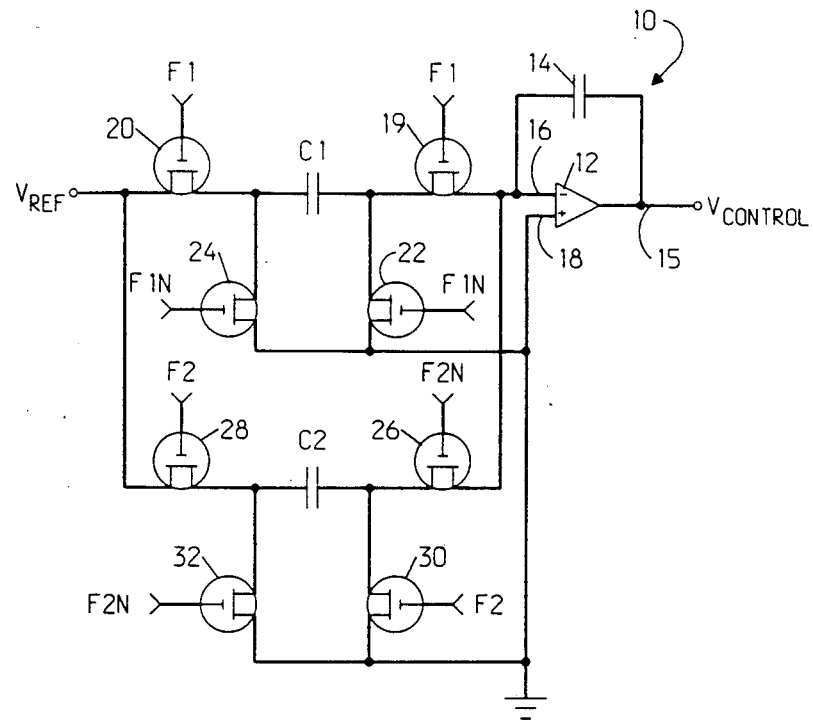
FIG. 1 is a schematic circuit diagram of one example of the present invention in the form of a frequency comparator.

The comparator 10 of FIG. 1 is a CMOS switched-capacitor circuit which includes an integrator formed by operational amplifier 12 having an integrating capacitor 14 connected between its output node 15 and its inverting input node 16. A control voltage Vcontrol is generated at the output node 15. The noninverting input node 18 of the amplifier 12 is connected to a signal ground reference voltage node. A first, through-switched capacitor C1 is connected between an input reference voltage node Vref and the inverting input node 16. A second, diagonally switched capacitor C2 is connected between the node Vref and the inverting input node 16, in parallel with the first capacitor C1.

The first capacitor C1 has both its sides isolated and switched to the grounded node 18 at a first frequency F1 by the transistor 19,20,22,24. The second capacitor C2 has its sides isolated and alternately switced to the grounded node 18 at a second frequency F2 by the transistors 26,28,30,32.

The gates of the transistors 19 and 20 are connected to a switching pulse train F1 of pulses which are at the first frequency F1. The gates of the transistors 22 and 24 are connected to a switching pulse train F1N of pulses which are also at the frequency of F1, but which ar nonoverlapping with the pulses F1 and 180 degrees out of phase with them.

The gates of the transistors 28 and 30 are connected to a switching pulse train F2 of pulses which are at the secondary frequency F2. The gates of the transistors 26 and 32 are connected to a switching pulse train F2N of pulses which are also at the frequency of F2, but which are nonoverlapping with the pulses F2 and 180 degrees out of phase with them. In the interest of minimizing the complexity of the FIG. 1, the transistor gates are simply lableled with their respective switching pulse inputs, rather than being shown connected by lines to a pulse source.

The capacitors C1 and C2, with their associated transistors form parallel sampled input networds to the node 16 of the integrator formed by the amplifier 12 and the integrating capacitor 14. Their inputs are summed at the node 16. The effect of the diagonal switching of the capacitor C2 is to reverse the polarity of the charge delivered to the integrating capacitor 14. Thus the charge contribution of the capacitor C2 is subtracted from that of the first capacitor C1 at the summing node 16.

It can be seen that if the capacitors C1 and C2 are equal in value, and the frequencies of the pulse trains F1 and F2 are also equal, then the sum of the charges at the node 16 will be zero. The sum at the node 16 will move in one or the other direction as the frequencies F1 and F2 differ. Thus the voltage at the node 15 can be taken as a frequency comparative output of the comparator 10. Any chosen differing values of the frequencies F1 and F2 may result in a zero sum at the node 16 by apropriate choice of the values of the capacitors C1 and C2 in accordance with the relationship $$(F1)(C1) = (F2)(C2)$$

It is a characteristic of MOS circuits that the relative capacitance values of devices can be very accurately determined. Therefore, the comparator 10 can readily compare any two chosen frequencies F1 and F2 with accuracy, regardless of whether these frequencies are integral multiples of each other.

Figure 2:
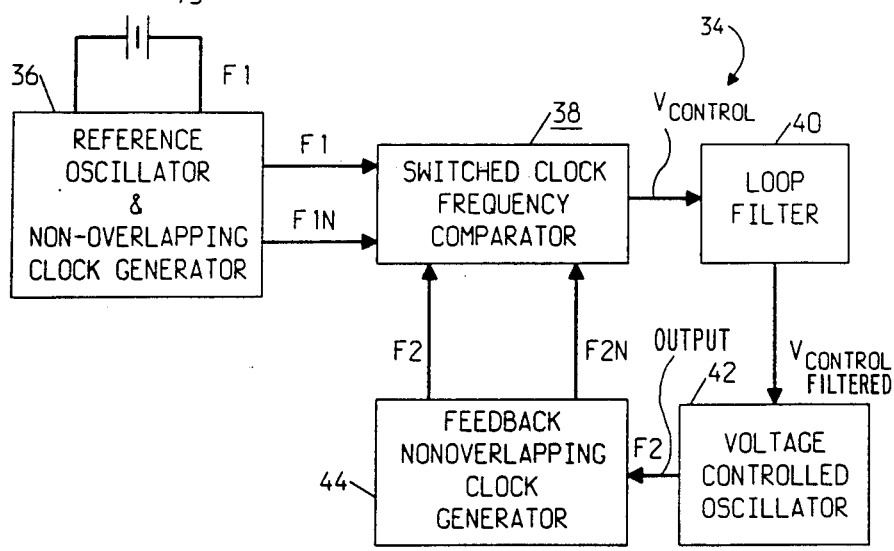
FIG. 2 is a schematic block circuit diagram of another example of the present invention in the form of a frequency lock loop which incorporates the comparator of FIG. 1

One particularly advantageous implementation of the comparator 10 of FIG. 1 is in the frequency lock loop (FLL) 34 shown in FIG. 2 in block form. The FLL 34 includes a reference frequency generating unit 36 which uses a watch crystal oscillating at 32.768 kHz to provide the nonoverlapping switching pulse trains F1 and F1N to a switched capacitor frequency comparator 38 such as the comparator 10 of FIG. 1. The output voltage Vcontrol of hte comparator 38 passes to a low-pass loop filter 40 for removal of the switching frequency components. From there, it is fed to a voltage-controlled oscillator 42 for generating a second pulse train of frequency F2. This second, derived pulse train is the frequency input for a nonoverlapping clock pulse generator 44 which generates the switching pulse trains F2 and F2N for the comparator 38.

With the exception of the frequency comparator 38, the elements 36, 40, 42, and 44 may be of known types for performing the requisite functions. It is particularly advantageous for elements to be of the switched capacitor type, since this permits greatly improved accuracy for a CMOS realization of the FLL 34. The voltage controlled oscillator 42 is preferably of the switched current mirror type, as described for example in the copending application Ser. No. 538,946 filed for R. G. Beale and A. Ganesan Oct. 4, 1983, entitled SWITCHED CURRENT MIRROR, and assigned to the same assignee as is the present invention.

In the comparator 10 the switches are simple MOS devices in order to avoid undue complexity in the circuit description. Other switching devices, such as transmission gates, may be substituted for these as desired. While the invention is particularly advanatgeous for MOS technology, it may also be realized with bipolar or other devices.

What is claimed is:

1. A frequency comparator of the type including:
   an operational amplifier having an inverting and noninverting input node and an output node, and
   an integrating capacitor connected between the output node and one of the input nodes of the amplifier, the other of the input nodes being connected to signal reference voltage node,
Wherein the improvement comprises:
   a first, sampled input network connected between an input reference voltage node and the one input node of the amplifier and including a first input capacitor,
   a second, sampled input network connected between the input reference voltage node and the one input node of the amplifier, in parallel with the first input network, and including a second input capacitor,
   first switching means for periodically isolating both sides of the first capacitor from and connecting them to the signal reference voltage node, at a first frequency rate, and
   second switching means for periodically isolating either side of the second capacitor from and connecting it to the signal reference voltage node, at a second frequency rate.

2. The comparator as defined in claim 1 wherein the first switching means isolates and then connects to the signal reference voltage node both sides of the first capacitor simultaneously, and wherein the second switching means isolates and then connects to the signal reference voltage either side of the second capacitor alternately.

3. The comparator as defined in claim 2 wherein the connecting of both sides of the first input capacitor to the input reference voltage node is out of phase and nonoverlapping with the connecting of both sides of the first input capacitor to the signal reference voltage node.

4. The comparator as defined in claim 3 wherein the first and second switching means comprise field effect transistors.

5. The comparator as defined in claim 4, comprising:
   a first transistor having its conduction path connected between the input reference voltage node and the one side of the first input capacitor;
   a second transistor having its conduction path connected between the other side of the first input capacitor and the one input node of the amplifier;
   a third transistor having its conduction path connected between the one side of the first input capacitor and the signal reference voltage node;
   a fourth transistor having its conduction path connected between the other side of the first input capacitor and the signal reference voltage node;
   a fifth transistor having its conduction path connected between the input reference voltage node and one side of the second capacitor;
   a sixth transistor having it conduction path connected between the other side of the second input capacitor and the one input node of the amplifier;
   a seventh transistor having its conduction path connected between the one side of the second input capacitor and the signal reference voltage node, and
   an eighth transistor having its conduction path connected between the other side of the second input capacitor and the signal reference voltage node.

6. A frequency lock loop apparatus, comprising:
   means for generating a first pair of nonoverlapping switching pulse trains of a first frequency;
   means responsive to a control voltage for generating a second pair of nonoverlapping switching pulse trains of a second frequency and generating an output signal of a second frequency,
   means comprising a switched capacitor frequency comparator for generating the control voltage in response to a sum of charges supplied by first and second sampled input networks operating in respons to the first and second pairs of switching pulse trains, respectively, the first and second sampled input networks being connected in parallel between an input reference voltage node and an input node of an undamped integrator, the first input network having a first input capacitor which is switched in response to the first pair of pulse trains, and the second input network having a second input capacitor which is switched in response to the second pair of pulse trains.

7. The apparatus as defined in claim 6 comprising a loop filter connected to the output of the integrator for removing the switching pulse frequencies;

a voltage controlled oscillator connected to the output of the loop filter for generating in response thereto an output of the second frequency, and a clock generator connected to the output of the voltage controlled oscillator for generating in response thereto the second pair of pulse trains of the second frequency for the frequency comparator.

8. The apparatus as defined in claim 7 wherein the voltage controlled oscillator is a switched current mirror circuit.

9. The apparatus as defined in claim 8 wherein the means for generating the first pair of pulse trains comprises a crystal oscillator having its output connected to a nonoverlapping switching pulse generator, an output of the switching pulse generator being connected to the first input network.

* * * * *